United States Patent
Noda et al.

(10) Patent No.: US 9,484,298 B1
(45) Date of Patent: Nov. 1, 2016

(54) NON-VOLATILE MEMORY DEVICE

(71) Applicant: KABUSHIKI KAISHA TOSHIBA, Minato-ku (JP)

(72) Inventors: Kotaro Noda, Yokkaichi (JP); Tomohiro Yamada, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/847,902

(22) Filed: Sep. 8, 2015

Related U.S. Application Data

(60) Provisional application No. 62/188,195, filed on Jul. 2, 2015.

(51) Int. Cl.
  *H01L 23/522* (2006.01)
  *H01L 27/115* (2006.01)
  *H01L 23/535* (2006.01)
  *H01L 23/532* (2006.01)

(52) U.S. Cl.
  CPC ......... *H01L 23/5228* (2013.01); *H01L 23/535* (2013.01); *H01L 23/53266* (2013.01); *H01L 27/11568* (2013.01); *H01L 27/11582* (2013.01)

(58) Field of Classification Search
  CPC .............. H01L 23/5228; H01L 23/53266; H01L 23/535; H01L 27/11568; H01L 27/11582
  See application file for complete search history.

(56) References Cited

U.S. PATENT DOCUMENTS

| | | | |
|---|---|---|---|
| 7,821,058 B2 | 10/2010 | Kidoh et al. | |
| 7,927,967 B2* | 4/2011 | Nomura et al. | .. H01L 27/11582 257/E21.54 |
| 8,154,068 B2 | 4/2012 | Katsumata et al. | |
| 2013/0228853 A1* | 9/2013 | Higuchi et al. | ..... H01L 29/7827 257/329 |

* cited by examiner

*Primary Examiner* — Roy Potter
*Assistant Examiner* — Paul Patton
(74) *Attorney, Agent, or Firm* — Oblon, McClelland, Maier & Neustadt, L.L.P.

(57) ABSTRACT

A non-volatile memory device includes a first electrode layer extending in a first direction and a first channel body extending through the first electrode layer in a second direction. The first electrode layer has, on a side surface, a first projecting portion expanding in a third direction perpendicular to the first direction and the second direction, and having a rounding shape in a tip of the first projecting portion.

15 Claims, 14 Drawing Sheets

NON-VOLATILE MEMORY DEVICE

CROSS-REFERENCE TO RELATED APPLICATIONS

This application is based upon and claims the benefit of priority from U.S. Provisional Patent Application 62/188,195 filed on Jul. 2, 2015; the entire contents of which are incorporated herein by reference.

FIELD

Embodiments described herein relate generally to a non-volatile memory device.

BACKGROUND

Development of non-volatile memory devices having memory cells three-dimensionally integrated has been in progress. For example, there exists a non-volatile memory device in which a plurality of word lines is stacked on a foundation layer, and memory cells are respectively disposed at the positions where a channel body extending through the word lines and each of the word lines intersect with each other. In such a non-volatile memory device, the layers of the word lines are thinned due to miniaturization of the memory cells, and the electrical resistance of the word line lowers the operation speed of the memory cells in some cases. Therefore, the technology for decreasing the electrical resistance of the word line has been needed.

DETAILED DESCRIPTION

Figure 1:
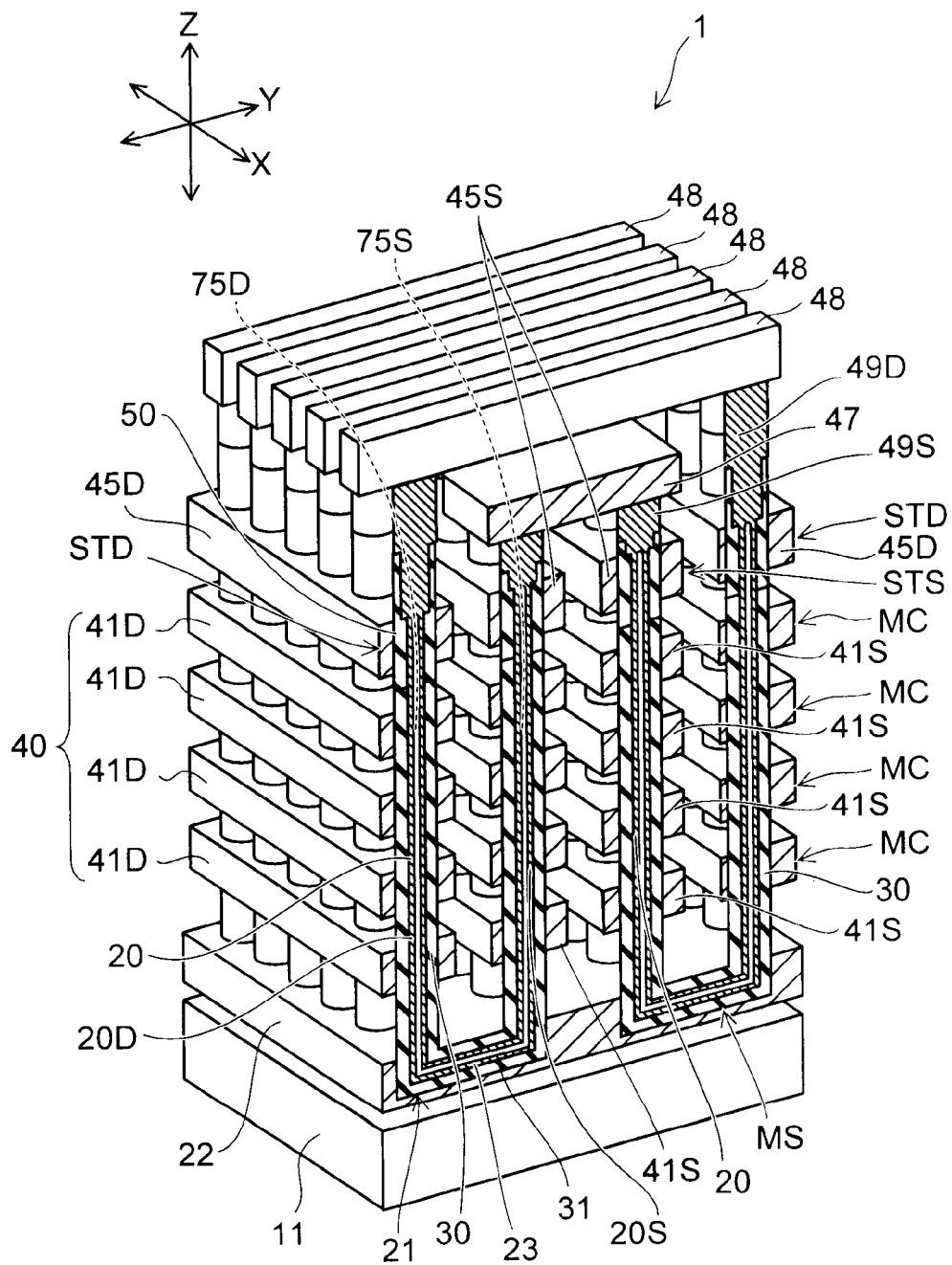
FIG. 1 is a perspective view schematically showing a non-volatile memory device according to a first embodiment.

According to one embodiment, a non-volatile memory device includes a first electrode layer extending in a first direction and a first channel body extending through the first electrode layer in a second direction. The first electrode layer has, on a side surface, a first projecting portion expanding in a third direction perpendicular to the first direction and the second direction, and having a rounding shape in a tip of the first projecting portion.

Various embodiments will be described hereinafter with reference to the accompanying drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

FIG. 1 is a perspective view schematically showing a non-volatile memory device 1 according to a first embodiment. In FIG. 1, insulating parts except insulating films formed inside walls of the memory holes are omitted.

The non-volatile memory device 1 is provided with a foundation layer 11, a semiconductor layer 22, and a laminated electrode 40. The foundation layer 11 includes a semiconductor substrate (e.g., a silicon substrate), an insulating film (e.g., an SiO$_2$ layer), a circuit, interconnections and so on. For example, it is also possible to dispose an active element such as a transistor or a passive element such as a resistor or a capacitor in the foundation layer 11 as described in U.S. Pat. No. 8,338,882 which is incorporated herein by reference.

The semiconductor layer 22 (a back gate layer) is disposed on the foundation layer 11 via an insulating film not shown. The semiconductor layer 22 is a silicon (Si) layer added with an impurity element such as boron (B). The laminated electrode 40 is disposed on the semiconductor layer 22 via an insulating film not shown.

The laminated electrode 40 includes, for example, electrode layers 41D on the drain side, and electrode layers 41S on the source side. As shown in FIG. 1, the electrode layers 41D and the electrode layers 41S are stacked in the Z-direction. Between these electrodes, there are disposed insulating films 103 (not shown in FIG. 1, see FIG. 3D). The insulating films 103 each include, for example, silicon oxide (SiO$_2$). The electrode layers 41D and the electrode layers 41S are each divided in the Y-direction (a first direction) in the same layer level into parts, and the parts are each disposed so as to extend in the X-direction. Between the electrode layers 41D and the electrode layers 41S, there is disposed an insulating film not shown. It should be noted that in the following explanation, the electrode layers 41D and the electrode layers 41S are explained separately from each other in some cases, or expressed collectively as electrode layers 41 in other cases. The same is applied to other constituents.

The non-volatile memory device 1 is further provided with selection gate electrodes 45D on the drain side, and selection gate electrodes 45S on the source side. The selection gate electrodes 45D, 45S are disposed on the laminated electrode 40 via an insulating film not shown. The electrode layers 41D are disposed between the semiconductor layer 22 and the selection gate electrodes 45D. The electrode layers 41S are disposed between the semiconductor layer 22 and the selection gate electrodes 45S.

Further, the number of the electrode layers 41 stacked one another is arbitrarily determined, but is not limited to four layers as shown in FIG. 1. The electrode layers 41 are each a silicon layer added with an impurity element such as boron (B), and having electrical conductivity. The selection gate electrodes 45D and 45S are each a silicon layer added with an impurity element such as boron (B), and having electrical conductivity.

The selection gate electrodes 45D and 45S are each disposed so as to extend in the X-direction. It should be noted that the selection gate electrodes 45D and the selection gate electrodes 45S are simply expressed as selection gate electrodes 45 without distinction in some cases.

The semiconductor layer 22, the laminated electrode 40, and the selection gate electrodes 45 are provided with memory holes 75. As the memory hole 75D, there is formed a hole extending through, for example, the selection gate electrode 45D and the electrode layers 41D, and extending in the −Z-direction. Further, the memory hole 75S extends through the selection gate electrode 45S and the electrode layers 41S, and extending in the −Z-direction. The pair of memory holes 75 are connected to each other via a PC (Pipe Connection) 21 disposed in the semiconductor layer 22.

In the inside of the memory holes 75 and the PC 21, there are disposed a channel body 20 and a semiconductor layer 23. The channel body 20 and the semiconductor layer 23 are each, for example, a semiconductor layer including silicon. The channel body 20 and the semiconductor layer 23 are each, for example, a polysilicon layer. Between the channel body 20 and the inside wall of each of the memory holes 75, there is disposed a memory film 30. Further, between the semiconductor layer 23 and the inside wall of the PC 21, there is disposed an insulating film 31.

For example, in the inside of the memory hole 75D, there is disposed the channel body 20D. In the inside of the memory hole 75S, there is disposed the channel body 20S. The channel body 20D is connected to the channel body 20S via the semiconductor layer 23.

It should be noted that it is also possible for the channel body 20 to completely fill in the space in each of the memory holes 75, or to leave a hollow in the core of each of the memory holes 75. Further, it is also possible to fill the hollow with an insulating body.

On the selection gate electrodes 45S, there is disposed a source line 47 via an insulating film not shown. The source line 47 is connected to the ends of the channel bodies 20S via respective vias 49S. The source line 47 is a metal wiring line, or a silicon layer added with impurities and having electrical conductivity.

Above the selection gate electrodes 45D and the source line 47, there is disposed a plurality of bit lines 48 via an insulating film not shown. The bit lines 48 are disposed so as to extend in the Y-direction. The bit lines 48 are each, for example, a metal wiring line or an electrically conductive silicon layer added with impurities. The bit lines 48 are connected to the ends of the channel bodies 20D via vias 49D, respectively. The material of the vias 49D and 49S is, for example, tungsten (W).

The selection gate electrode 45D, the channel body 20D, and the memory film 30 disposed therebetween constitute a selection transistor STD on the drain side. The memory film 30 also functions as a gate insulating film of the selection transistor STD.

The selection gate electrode 45S, the channel body 20S, and the memory film 30 disposed therebetween constitute a selection transistor STS on the source side. The memory film 30 also functions as a gate insulating film of the selection transistor STS.

Between the selection transistor STD and the semiconductor layer 22, there is disposed a plurality of memory cells MC each using the electrode layer 41D as a control gate. Similarly, between the selection transistor STS and the semiconductor layer 22, there is also disposed a plurality of memory cells MC each using the electrode layer 41S as a control gate. The plurality of memory cells MC, the selection transistor STD and the selection transistor STS are connected in series to each other via the semiconductor layer 23 of the PC 21 to constitute one memory string (a NAND string) MS.

Figure 2A:
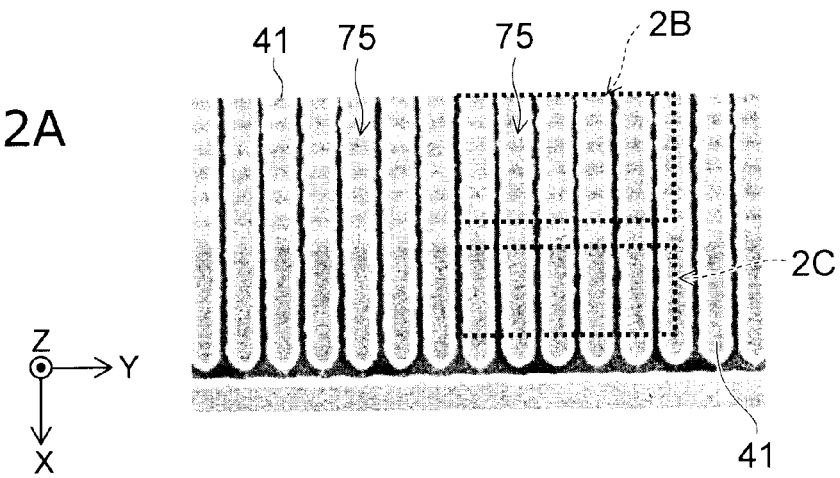
FIGS. 2A through 2C are each an SEM image showing the electrode layers of the non-volatile memory device according to the first embodiment.
Figure 2B:
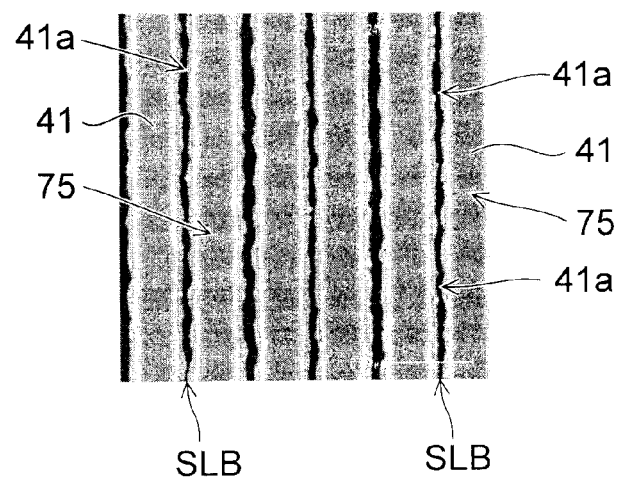
Figure 2C:
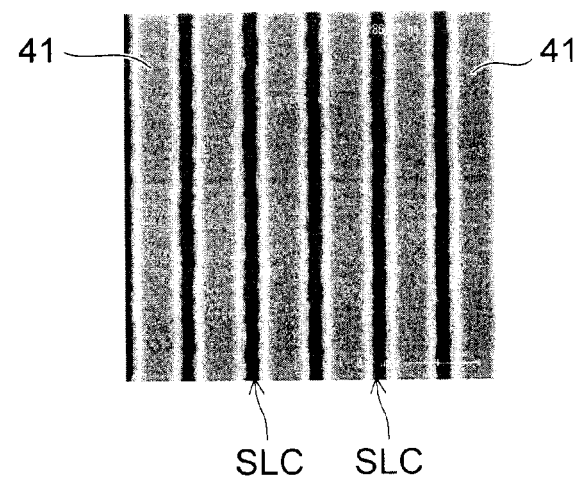

FIGS. 2A through 2C are each an SEM image showing the electrode layers 41 of the non-volatile memory device according to the first embodiment. FIG. 2B is a diagram obtained by enlarging the area 2B shown in FIG. 2A. FIG. 2C is a diagram obtained by enlarging the area 2C shown in FIG. 2A.

As shown in FIG. 2A, the plurality of electrode layers 41 are each disposed so as to extend in the X-direction. Further, the plurality of electrode layers 41 are disposed in parallel to each other in the Y-direction. In the area 2B shown in FIG. 2A, the memory holes 75 are formed. In contrast, in the area 2C, which corresponds to end portions of the electrode layers in the Y-direction, the memory holes 75 are not formed. In other words, the end portion of the electrode layer 41 is not provided with the memory holes 75.

As shown in FIG. 2B, the electrode layers 41 each have a plurality of projecting portions 41a disposed on the side surfaces extending in the X-direction. Each of the projecting portions 41a is a protruding section of the electrode layer 41 expanding in the Y-direction or the −Y-direction. In contrast, in the end portions of the electrode layers 41 shown in FIG. 2C, the projecting portions 41a are not formed. Therefore, when comparing the distance between the electrode layers 41 adjacent in the Y-direction to each other, the distance $SL_B$ between the electrode layers 41 in the area 2B is shorter than the distance $SL_C$ between the electrode layers 41 in the area 2C.

Figure 3A:
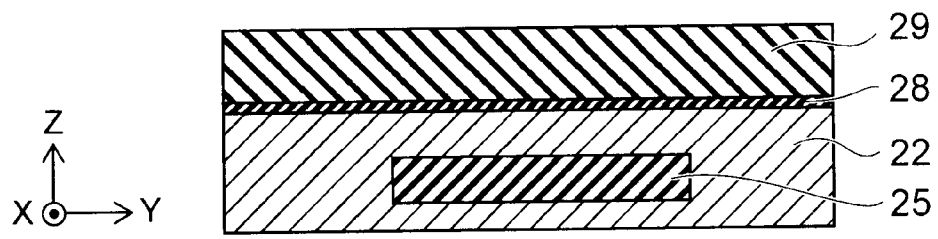
FIGS. 3A through 3N, and 3P are schematic cross-sectional views sequentially showing manufacturing processes of the non-volatile memory device according to the first embodiment.

Then, a method of manufacturing the non-volatile memory device 1 according to the first embodiment will be explained with reference to FIGS. 3A through 3N, and 3P. FIGS. 3A through 3N, and 3P are schematic cross-sectional views sequentially showing manufacturing processes of the non-volatile memory device 1.

As shown in FIG. 3A, an insulating film 28 and an insulating film 29 are formed on the semiconductor layer 22. The semiconductor layer 22 is formed on, for example, a silicon substrate not shown via an insulating film. The insulating film 28 is, for example, a metal oxide film such as tantalum oxide (TaO). The insulating film 29 is, for example, a silicon oxide film. The semiconductor layer 22 is, for example, a silicon layer doped with boron (B) and having electrical conductivity, and has a sacrifice layer 25 embedded therein. The sacrifice layer 25 is, for example, a silicon nitride layer, and is embedded in a part where the PC 21 is to be formed.

Figure 3B:
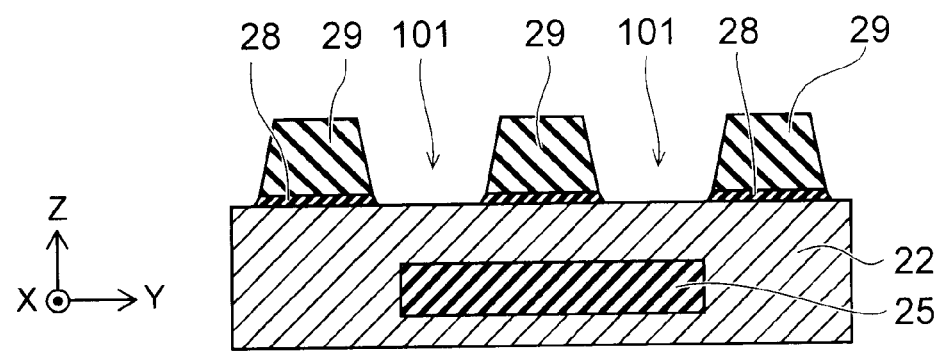

As shown in FIG. 3B, the insulating film 29 and the insulating film 28 are selectively removed to form grooves 101. The grooves 101 are disposed so as to extend in the X-direction, and the insulating film 29 and the insulating film 28 are processed to form a strip pattern disposed so as to extend in the X-direction.

Figure 3C:
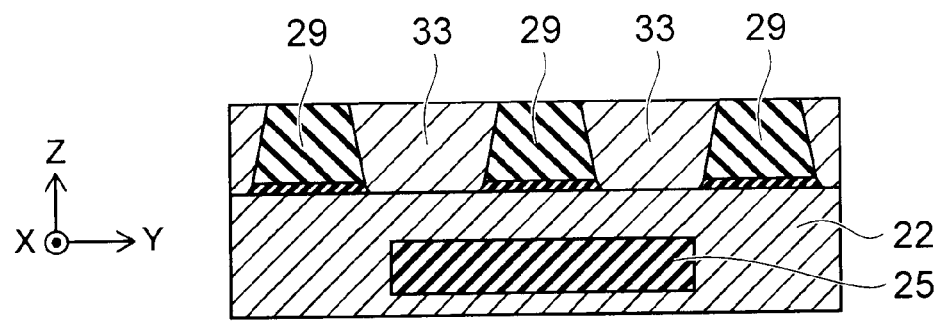

As shown in FIG. 3C, the semiconductor layer 33 is formed in each of the grooves 101. The grooves 101 are each filled with the semiconductor layer 33, and the upper surface of the semiconductor layer 33 is positioned in the same level as the upper surface of the insulating film 29. The semiconductor layer 33 is, for example, a silicon layer doped with boron (B) and having electrical conductivity.

Figure 3D:
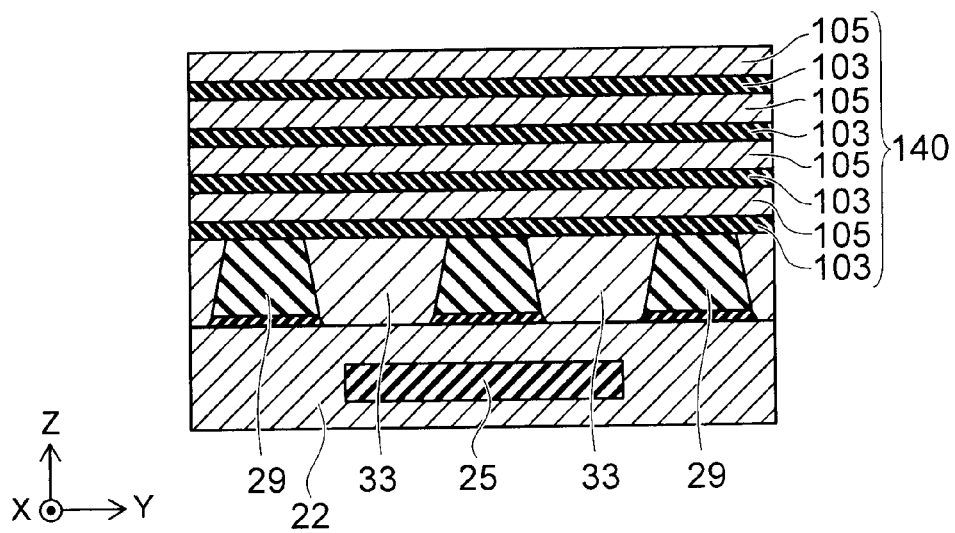

As shown in FIG. 3D, a laminated body 140 is formed on the insulating film 29 and the semiconductor layer 33. The laminated body 140 includes the insulating films 103 and the electrically conductive layers 105 stacked alternately. The insulating films 103 are each, for example, a silicon oxide film. The electrically conductive layers 105 are each, for example, a silicon layer. The number of the electrically conductive layers 105 stacked coincides with the number of the memory cells MC disposed in the Z-direction.

Figure 3E:
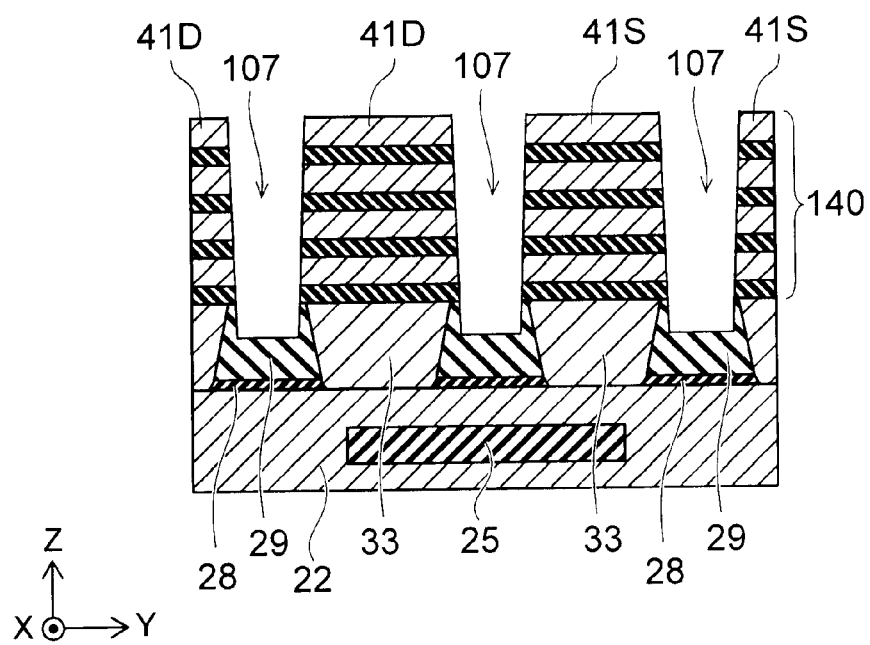

As shown in FIG. 3E, slits 107 having a depth enough to reach the insulating film 29 are formed on the upper surface of the laminated body 140. The slits 107 are formed by selectively etching the insulating films 103 and the electrically conductive layers 105 using, for example, RIE (Reactive Ion Etching). On this case, the insulating film 28 functions as an etching stopper layer to prevent the slit 107 from being formed to have a depth so deep as to reach the inside of the semiconductor layer 22. The slits 107 are each disposed so as to extend in the X-direction to divide the insulating films 103 and the electrically conductive layers 105. Thus, the electrically conductive layers 105 are each divided into the electrode layers 41D and 41S.

Figure 3F:
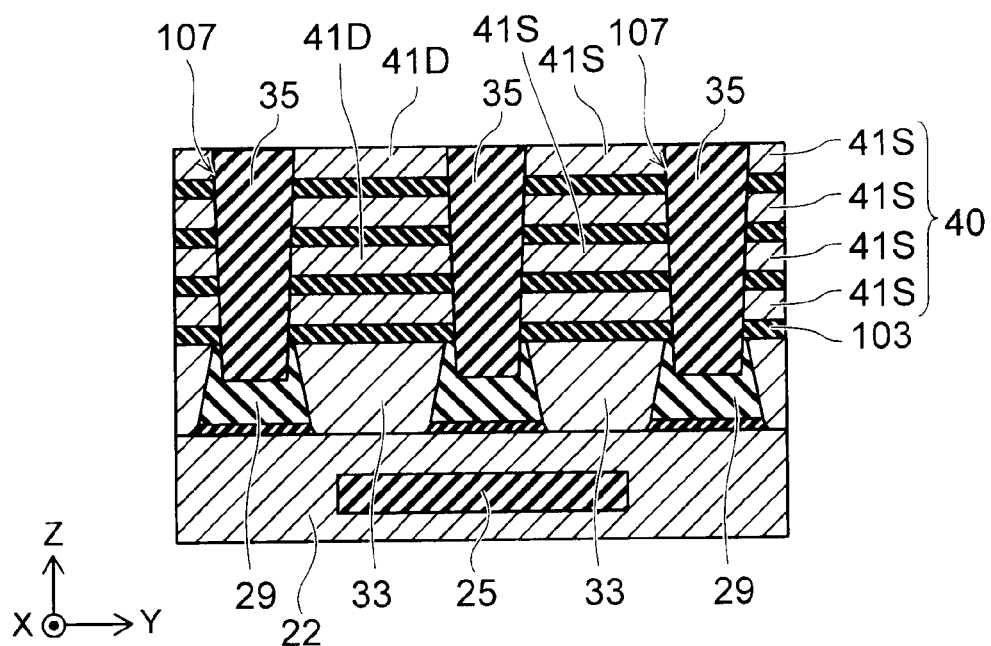

As shown in FIG. 3F, a sacrifice film 35 is formed inside the slit 107. The sacrifice film 35 is, for example, a silicon nitride film, and is embedded inside the slit 107. For example, the sacrifice film 35 is formed so that the upper surface of the sacrifice film 35 is positioned in the same level (height) as the upper surface of the laminated body 140.

Figure 3G:
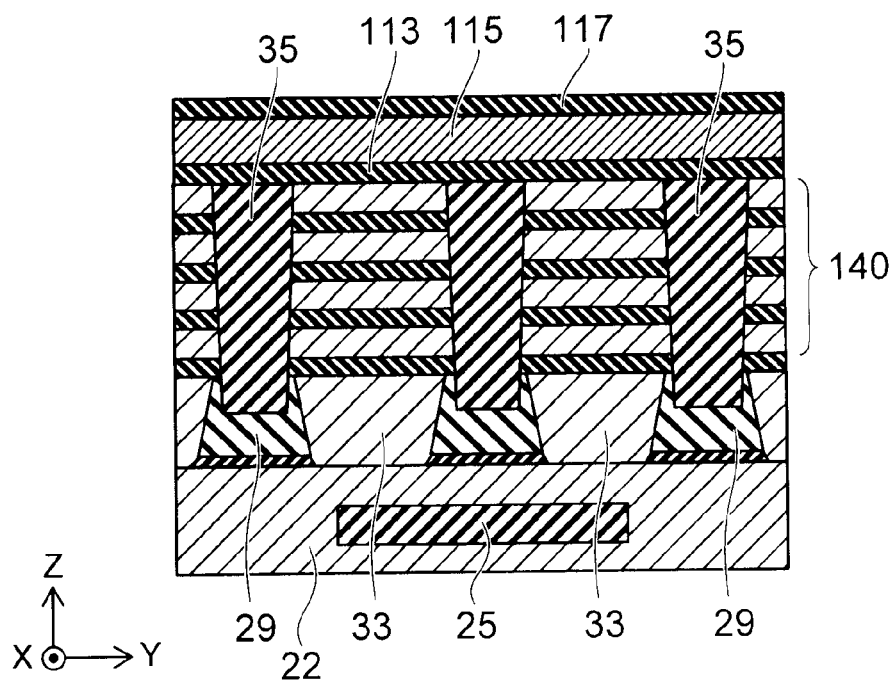

As shown in FIG. 3G, an insulating film 113, an electrically conductive layer 115, and an insulating film 117 are sequentially formed on the laminated body 140 and the sacrifice films 35. The insulating film 113 is, for example, a silicon oxide film. The electrically conductive layer 115 is, for example, a silicon layer.

Figure 3H:
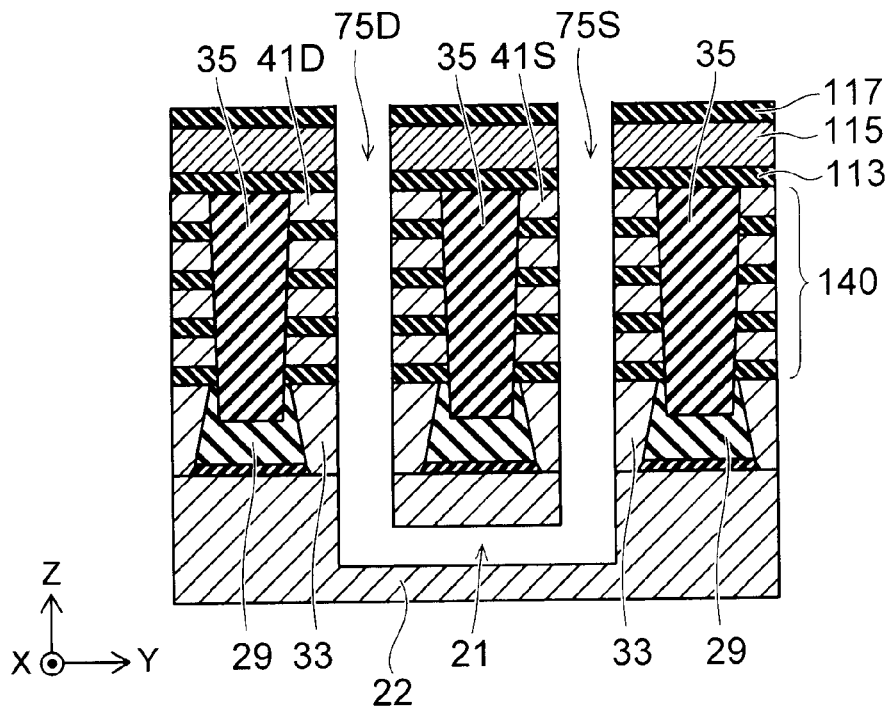

As shown in FIG. 3H, the memory holes 75D and 75S are formed. The memory hole 75D is formed so as to extend through the electrode layers 41D, and have a depth enough to reach the semiconductor layer 22. The memory hole 75S is formed so as to extend through the electrode layers 41S, and have a depth enough to reach the semiconductor layer 22. The memory holes 75D and 75S are formed on the upper surface of the insulating film 117 to have a depth enough to reach the sacrifice layer 25 in the semiconductor layer 22. The memory holes 75D and 75S are formed by, for example, selectively etching the insulating film 117, the electrically conductive layer 115, the insulating film 113, the laminated body 140, the semiconductor layer 33, and the semiconductor layer 22 using RIE.

Further, the etchant is injected via the memory holes 75D and 75S to selectively etch the sacrifice layer 25. For example, in the case in which the sacrifice layer 25 is made of silicon nitride, hot phosphoric acid can be used as the etchant. Thus, it is possible to selectively remove the sacrifice layer 25 to form the PC 21 without etching the insulating film 117, the electrically conductive layer 115, the insulating film 113, the laminated body 140, the semiconductor layer 33, and the semiconductor layer 22.

Figure 3I:
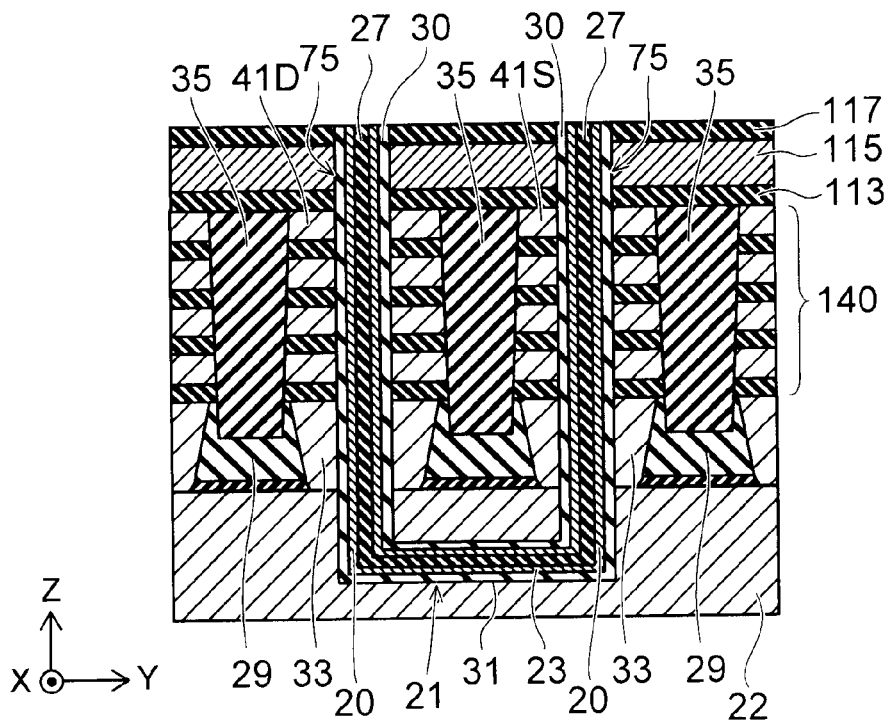

As shown in FIG. 3I, the memory film 30, the channel body 20, and an insulating film 27 are sequentially formed inside the memory holes 75D and 75S. At the same time, the insulating film 31 and the semiconductor layer 23 are also sequentially formed inside the PC 21. The memory film 30 has, for example, an ONO (Oxide/Nitride/Oxide) structure having a silicon oxide film, a silicon nitride film, and a silicon oxide film stacked one another (see FIG. 6A). The channel body 20 is a semiconductor layer, and is, for example, a silicon layer. The insulating film 27 is, for example, a silicon oxide film. The insulating film 31 has the same laminate structure as the memory film 30, and the semiconductor layer 23 includes the same material as the channel body 20.

Figure 3J:
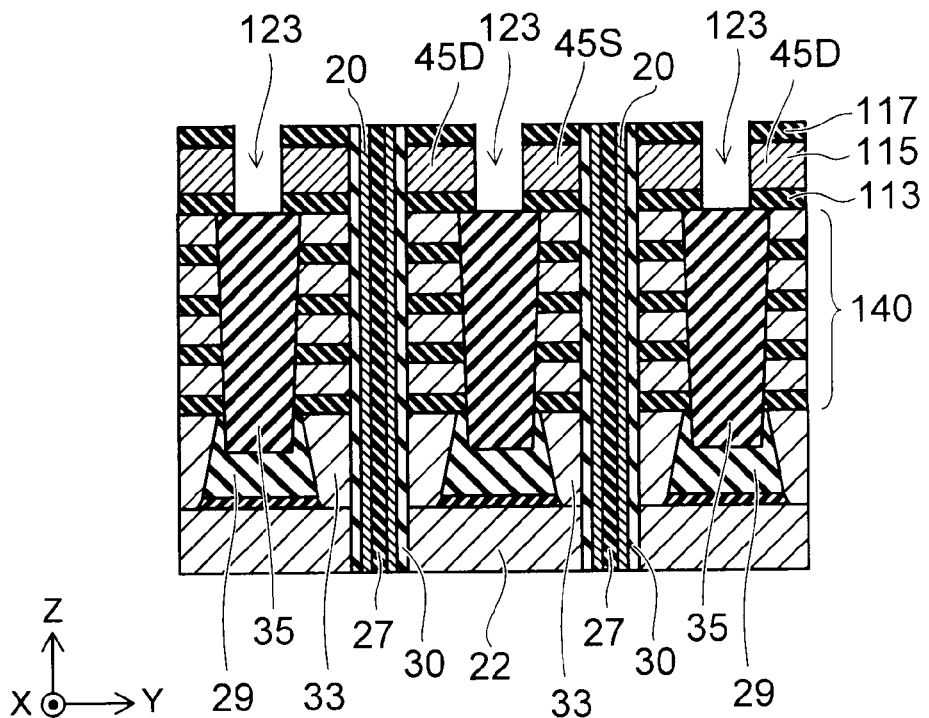

As shown in FIG. 3J, grooves 123 each communicating with the sacrifice film 35 are formed on the upper surface of the insulating film 117. The grooves 123 are each disposed so as to extend in the X-direction to divide the insulating film 117, the electrically conductive layer 115, and the insulating film 113. Thus, the electrically conductive layer 115 is divided into the control gates 45D and 45S. It should be noted that in FIG. 33 and the subsequent drawings, the part of the PC 21 will be omitted.

Figure 3K:
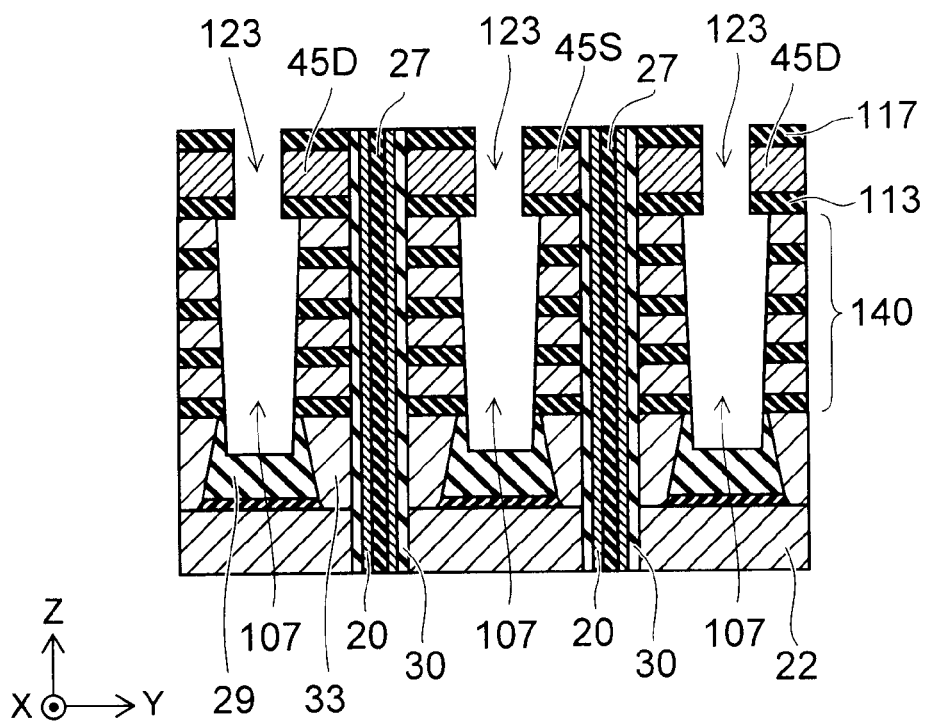

As shown in FIG. 3K, the sacrifice films 35 are selectively removed to restore the slits 107. For example, by making the etchant penetrate via the grooves 123, the sacrifice films 35 can selectively be etched. In the case in which the sacrifice films 35 are silicon nitride films, hot phosphoric acid, for example, is used as the etchant. Thus, it is possible to selectively remove the sacrifice films 35 without etching the insulating film 117, the electrically conductive layer 115, the insulating film 113, the laminated body 140, and the insulating film 29.

Figure 3L:
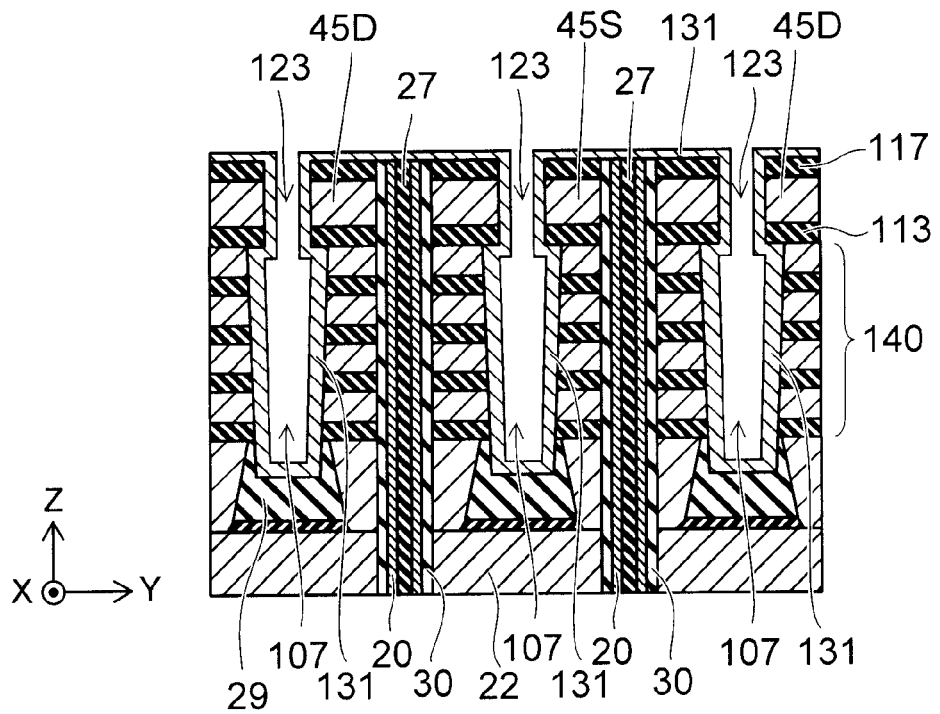

As shown in FIG. 3L, a metal film 131 covering the inside surfaces of the slits 107 and the sidewalls of the grooves 123 is formed. The metal film 131 is formed using, for example, a CVD (Chemical Vapor Deposition) method. The metal film 131 includes at least one metal element out of, for example, nickel (Ni), cobalt (Co), titanium (Ti), tungsten (W), and molybdenum (Mo). The metal film 131 also covers the surface of the insulating film 117, and the channel bodies 20, the memory films 30, and the insulating film 27 formed inside the memory holes 75D and 75S.

Figure 3M:
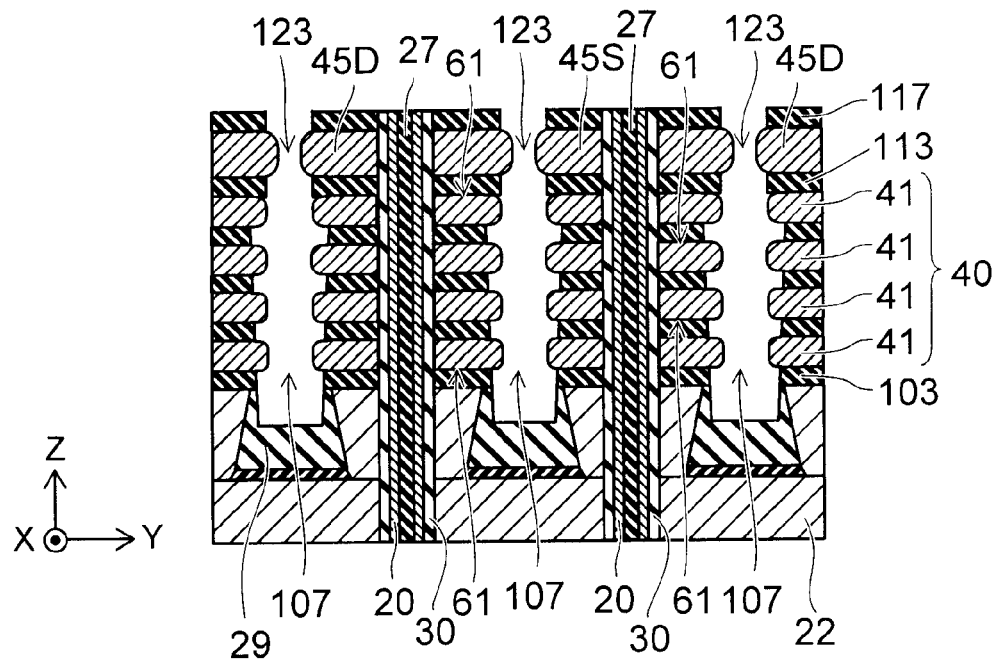
Figure 3N:
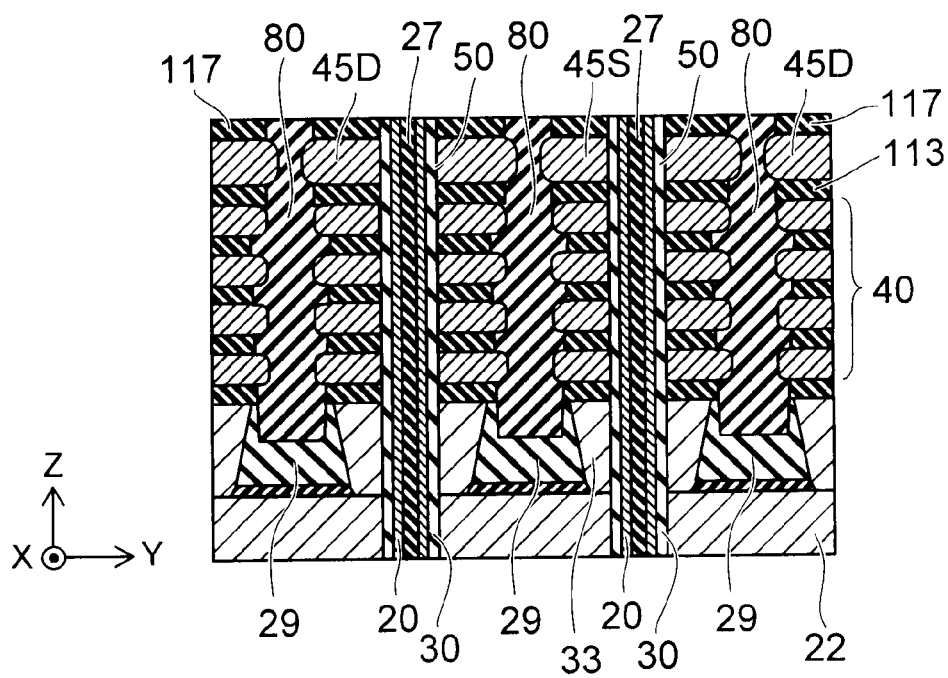
Figure 3P:
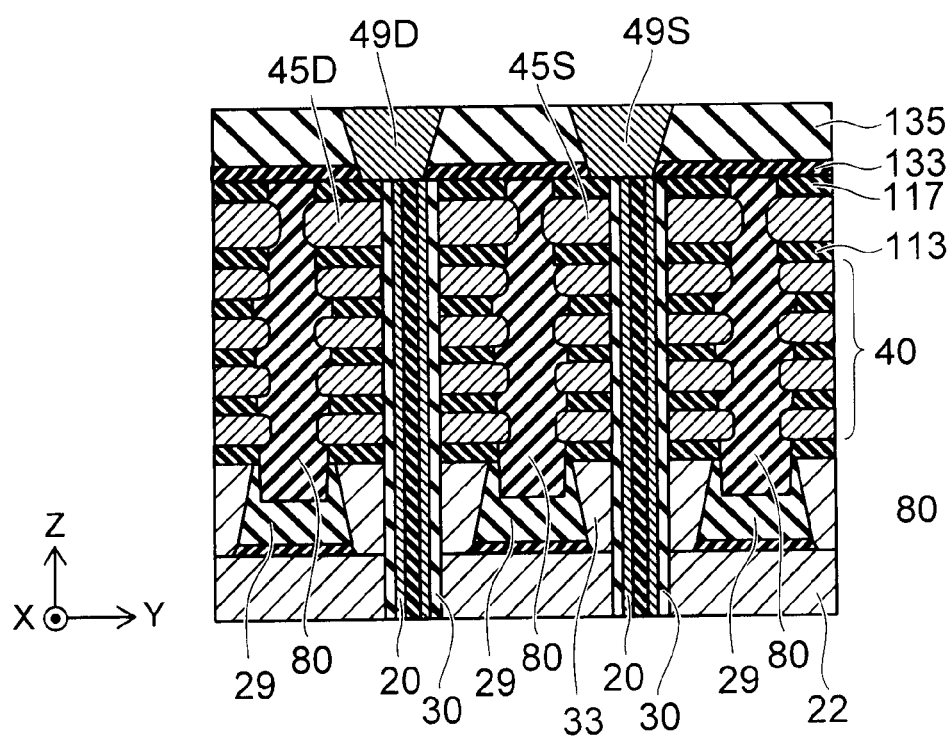

As shown in FIG. 3M, by reacting the metal film 131 with the electrode layers 41 and the selection gate electrodes 45, metal silicides 61 are formed. For example, by heat-treating the silicon substrate provided with the structure shown in FIG. 3L at a predetermined temperature (e.g., 500° C.), the electrode layers 41 are each changed into a silicide from the side surface. Subsequently, the unreacted metal film 131 formed on the surfaces of the insulating films 29, 103, 113, and 117 is removed by etching.

As shown in FIG. 3N, insulating films 80 are formed inside the slits 107 and the grooves 123. The insulating films 80 are each, for example, a silicon oxide film. The upper surfaces of the insulating films 80 are positioned in the same level of the upper surface of the insulating film 117.

As shown in FIG. 3P, insulating films 133 and 135 covering the insulating films 80, 117, the channel bodies 20, the memory films 30, and the insulating film 27 are formed. Subsequently, vias 49D and 49S extending through the insulating films 133 and 135 and having contact with the respective channel bodies 20 are formed. Further, the source lines 47 and the bit lines 48 are formed to complete the non-volatile memory device 1.

Figure 4A:
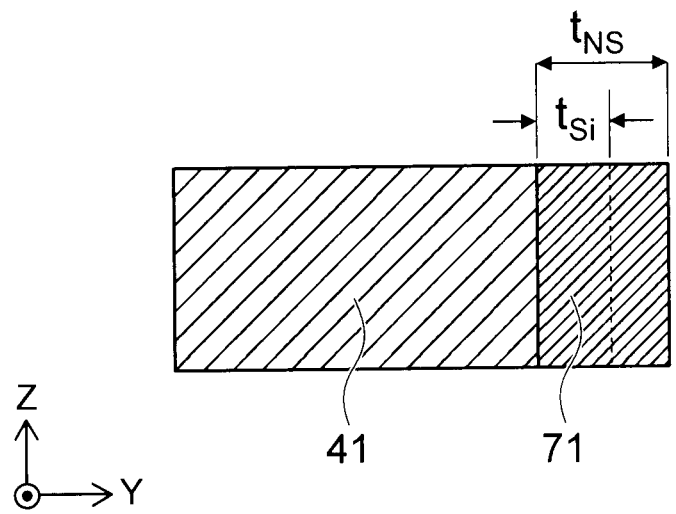
FIGS. 4A and 4B are schematic cross-sectional views each showing the electrode layers of the non-volatile memory device according to the first embodiment.
Figure 4B:
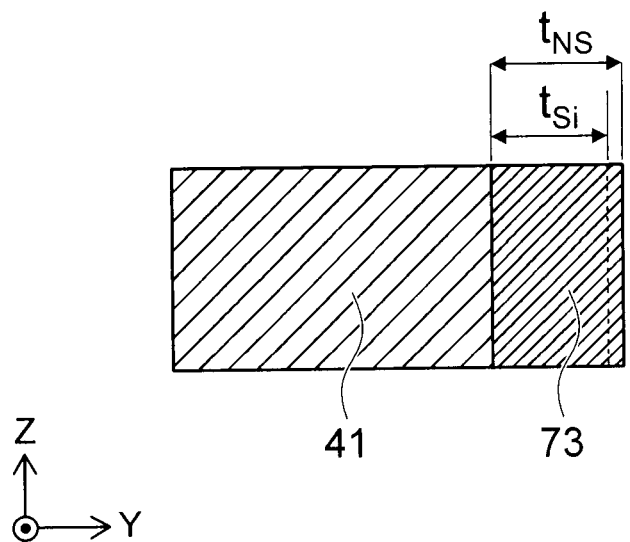

FIGS. 4A and 4B are schematic cross-sectional views each showing the electrode layer 41 provided with a nickel silicide. FIG. 4A is a schematic diagram showing a cross-sectional surface when forming the silicide 71 ($Ni_2Si$) high in the proportion of nickel. FIG. 4B is a schematic diagram showing a cross-sectional surface when forming the silicide 73 (NiSi) including nickel and silicon at substantially the same proportions. The dotted lines shown in FIGS. 4A and 4B each represent the position of the side surface of the electrode layer 41 before the silicide is provided.

As shown in FIG. 4A, the silicide 71 is formed inside the electrode layer 41, and at the same time formed so as to expand outside from the side surface. For example, assuming that the width in the Y-direction of the silicide is $t_{NS}$, and the width in the Y-direction of the part formed inside the electrode layer 41 is $t_{Si}$, the cubic expansion coefficient ($t_{NS}/t_{Si}$) of the silicide 71 is, for example, 1.64. Further, the specific resistance of the silicide 71 is, for example, 34 through 50 μΩcm. In contrast, the cubic expansion coefficient of the silicide 73 shown in FIG. 4B is, for example, 1.10, and the specific resistance thereof is 14 through 20 μΩcm.

Figure 5A:
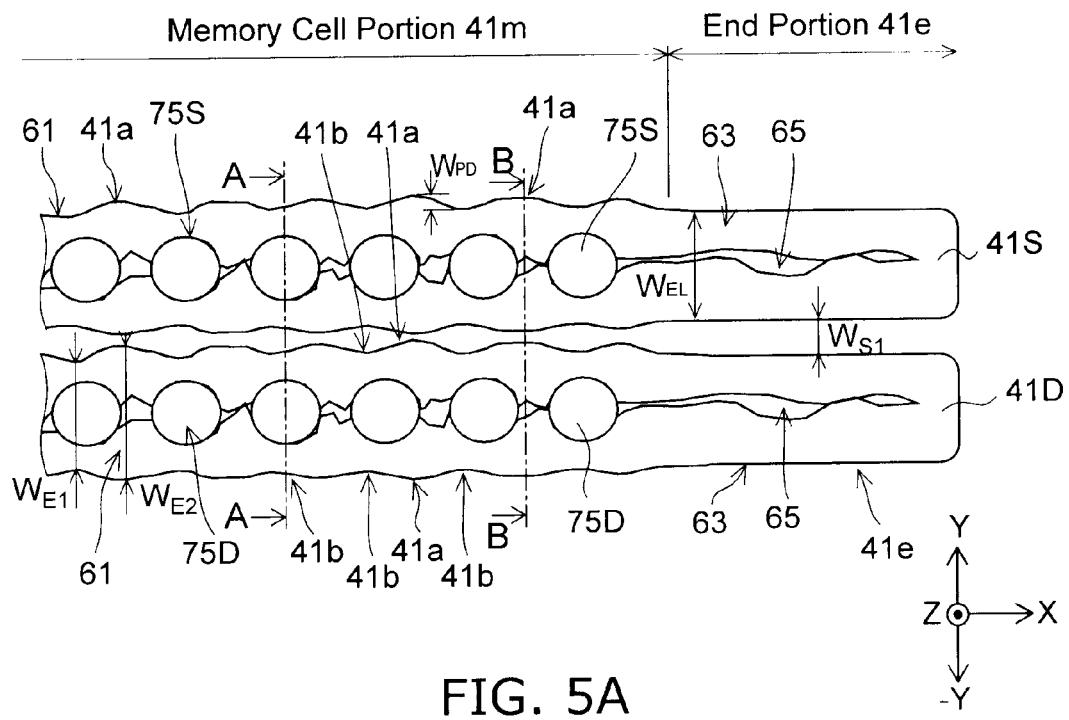
FIGS. 5A and 5B are plan views schematically showing the electrode layers of the non-volatile memory device according to the first embodiment.
Figure 5B:
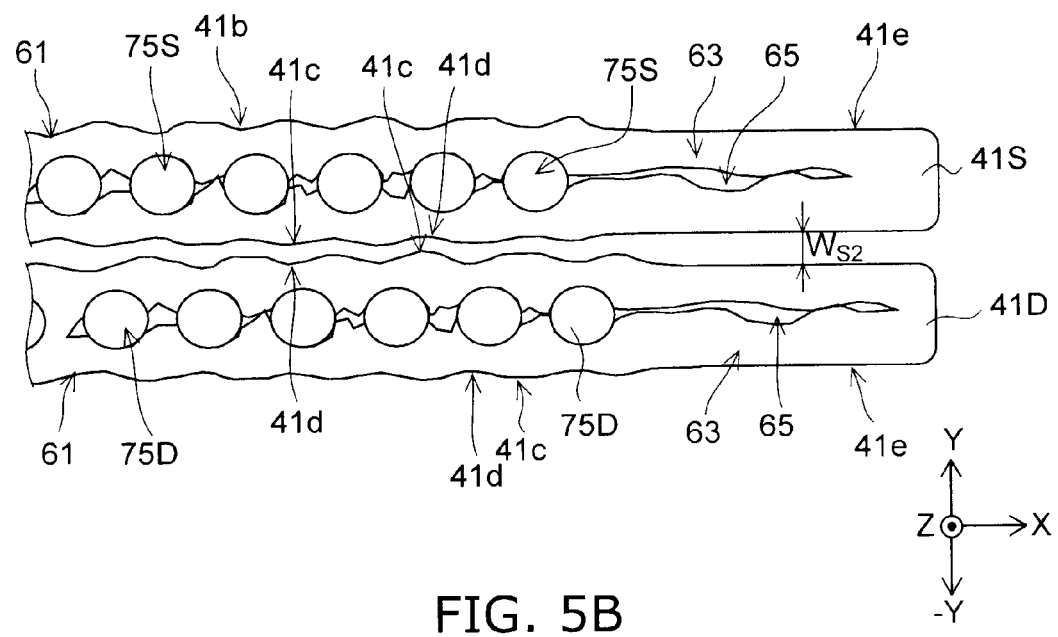

FIGS. 5A and 5B are plan views schematically showing the electrode layers 41 according to the first embodiment. FIGS. 5A and 5B each show the electrode layer 41S and the electrode layer 41D adjacent to the electrode layer 41S.

The electrode layers 41D and 41S each include a memory cell portion 41m provided with the memory cells MC, and an end portion 41e. The memory holes 75 each include the channel body 20, the insulating film 27, and the memory film 30 (see FIG. 6A). The memory holes 75 are each disposed so as to have a circular shape.

Further, each of the electrode layers 41D and 41S includes the metal silicide 61, the metal silicide 63, and a part 65 not changed into the silicide. The metal silicide 61 is included in the memory cell portion 41m. The metal silicide 63 is included in the end portion 41e. The metal silicides 61 and 63 are each, for example, a nickel silicide.

For example, in the memory cell portion 41m, the number of the silicon atoms per unit length in the X-direction is smaller compared to the end portion 41e. Therefore, the proportion of the metal atoms included in the metal silicide 61 becomes higher than the proportion of the silicon atoms. In contrast, in the metal silicide 63 included in the end portion 41e, the proportion of the metal atoms approaches the proportion of the silicon atoms. Therefore, the cubic expansion coefficient of the metal silicide 61 becomes higher than the cubic expansion coefficient of the metal silicide 63. Further, the side surface of the part where the memory hole 75 is disposed is provided with the projecting portion 41a having the metal silicide 61 partially expanding. The projecting portion 41a has, for example, a tip having a sweeping or rounded shape.

As shown in FIG. 5A, the projecting portion 41a corresponds to the part generated by the cubic expansion of the electrode layer 41 in the Y-direction or the −Y-direction. The projecting portion 41a is formed by changing the part between the memory holes 75 adjacent in the X-direction to each other into the silicide. In contrast, in the part (non-projecting portion 41b) between the side surface of the electrode layer 41 and each of the memory holes 75, since the volume is small, the projection width is suppressed even if the part is changed into the silicide. As a result, the plurality of projecting portions 41a are formed along the side surfaces of the memory cell portion 41m. For example, the width $W_{E1}$ in the Y-direction of the part provided with the memory hole becomes narrower than the width $W_{E2}$ in the Y-direction of the part between the memory holes 75.

For example, the electrode layer 41 may expands about 8 nm on a side thereof at a position where the projection portion 41a is formed, and expands about 4 nm on the side thereof where a depressed portion adjacent to the projection portion 41a is formed. A width $W_{PD}$ between the tip level of the projecting portion 41a and a bottom level of the depressed portion adjacent thereto is about 4 nm in the Y direction. The width $W_{PD}$ is about 10% of a width $W_{EL}$ of the electrode layer 41. Since such an expanded amount depends on a proportion of nickel, the expanded amount becomes less as the nickel proportion is reduced. The expanded amount may inevitably include influence with uncertainty in the silicidizing conditions.

In contrast, the end portion 41e not provided with the memory hole 75 includes the metal silicide 63. In the metal silicide 63, since the proportion of the metal atoms is approximate to the proportion of the silicon atoms, the cubic expansion is suppressed. Therefore, the projecting portion 41a is not formed on the side surface of the end portion 41e. Therefore, the distance $W_{S1}$ between the end portion 41e of the electrode layer 41S and the end portion 41e of the electrode layer 41D becomes longer than the distance between the memory cell portions 41m. For example, the electrode layer 41 may expands about 5.0 nm on a side thereof at the end portion 41e.

In the case in which the metal silicides 61 and 63 are each the nickel silicide, the specific resistance of the metal silicide 61 becomes higher than the specific resistance of the metal silicide 63. Therefore, although there is a concern that the electrical resistance of the memory cell portion 41m becomes high, the electrical resistance can be inhibited from increasing due to the cubic expansion of the projecting portion 41a.

As shown in FIG. 5B, it is also possible to adopt the disposition in which the positions of the memory holes 75S provided to the electrode layer 41S and the positions of the memory holes 75D provided to the electrode layer 41D are shifted from each other. In other words, it is also possible to dispose that the memory holes 75S are positioned between the memory holes 75D adjacent to each other when viewed in the Y-direction.

By disposing the memory holes 75D and 75S in such a manner, between the electrode layer 41S and the electrode layer 41D, for example, the projecting portion 41c provided to the electrode layer 41S is formed so as to face the non-projecting portion 41d in the electrode layer 41D. In other words, the projecting portion 41c of the electrode layer 41S expands toward the non-projecting portion 41d of the electrode layer 41D. Further, the projecting portion 41c of the electrode layer 41S expands in the direction toward the channel body 20 of the memory hole 75D. Thus, it is possible to prevent the projecting portion 41c of the electrode layer 41S and the projecting portion 41c of the electrode layer 41D from having contact with each other to electrically short to each other. In other words, it becomes possible to decrease the distance $W_{S2}$ between the electrode layer 41S and the electrode layer 41D.

Figure 6A:
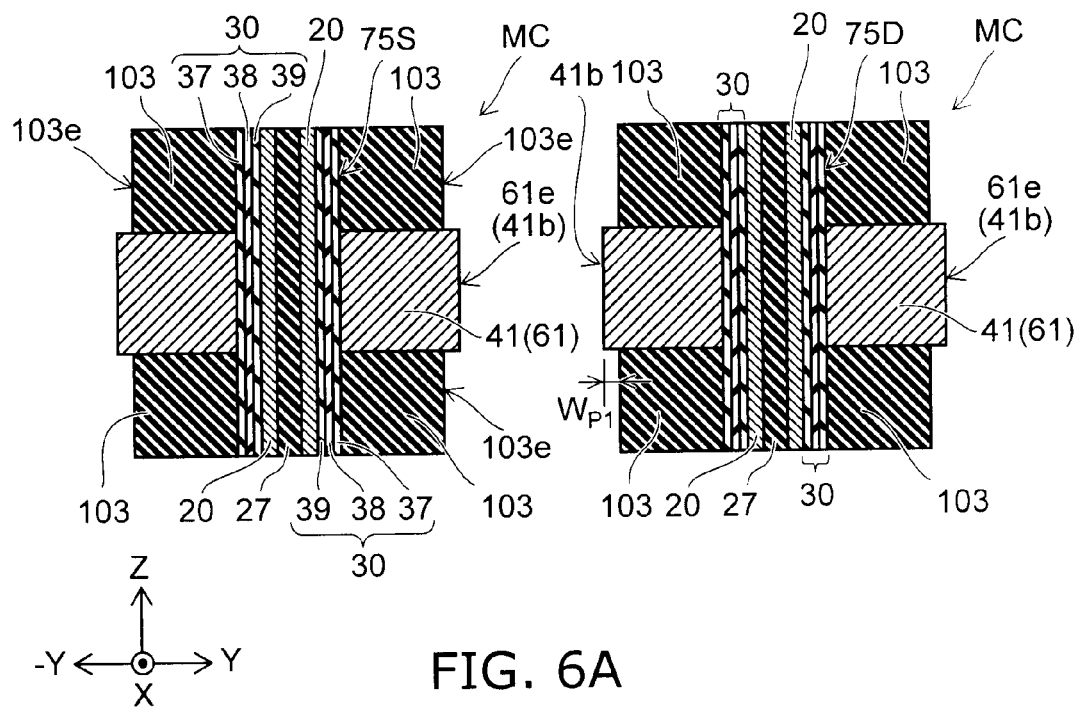
FIGS. 6A and 6B are schematic cross-sectional views each showing the electrode layers of the non-volatile memory device according to the first embodiment.
Figure 6B:
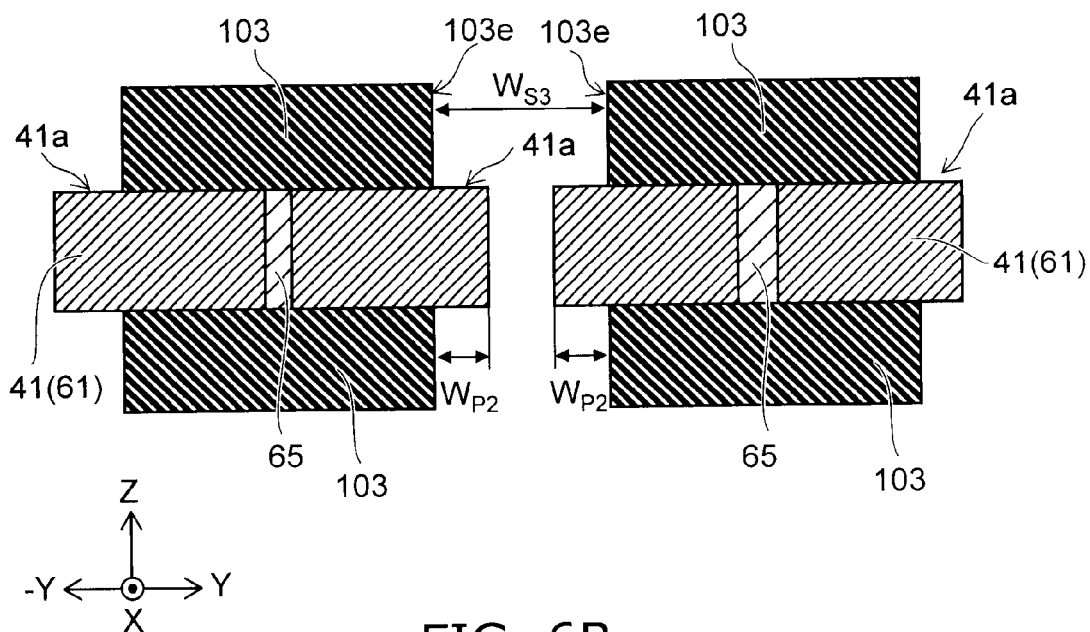

FIGS. 6A and 6B are schematic cross-sectional views each showing the electrode layers 41. FIG. 6A is schematic diagram showing a cross-sectional surface along the line A-A shown in FIG. 5A. FIG. 6B is a cross-sectional view along the line B-B shown in FIG. 5A.

FIG. 6A shows the cross-sectional surface of the part provided with the memory holes 75D and 75S, and shows the structure of the memory cells MC. The memory cells MC are each disposed in a part where the memory hole 75 extends through the electrode layer 41. The memory cells MC each include the channel body 20, the memory film 30, and the electrode layer 41. The electrode layer 41 is disposed between the insulating films 103 in the Z-direction.

As shown in FIG. 6A, the memory film 30 includes, for example, a first film 37, a second film 38, and a third film 39. The first film 37 (a first insulating film) is formed on the inside surface of the memory hole 75. The second film 38 is formed on the first film 37 in the inside of the memory hole 75. The third film 39 is formed on the second film 38 in the inside of the memory hole 75.

The first film 37 includes, for example, a silicon oxide film or a metal oxide film. The first film 37 functions as, for example, a block insulating film. The second film 38 is, for example, a silicon nitride film, and a part of the second film 38 acts as a charge storage portion between the channel body 20 and the electrode layer 41. The third film 39 is, for example, a silicon oxide film, and functions as a tunnel insulating film. Specifically, the charge is injected from the channel body 20 to the second film 38 via the third film 39.

The electrode layer 41 includes the metal silicide 61. The metal silicide 61 is formed so as to have contact with the first film 37 out of the memory film 30. For example, the metal film 131 having the thickness enough to change the entire part between the side surface of the electrode layer 41 (see FIG. 4A) and the memory film 30 into the silicide is formed, and then the heat treatment is performed. Thus, the part between the side surface of the electrode layer 41 and the memory film 30 is changed into the silicide from the side surface of the electrode layer 41 to the depth reaching the memory film 30. Further, the metal silicide 61 expands in volume, and the end portion 61e projects outward from the send surface 103e of the insulating film 103 in the Y-direction. It should be noted that the end portion 61e corresponds to the non-projecting portion 41b shown in FIG. 5A.

FIG. 6B shows a cross-sectional surface between the memory holes 75 adjacent in the X-direction to each other. In this part, since the memory hole 75 is not disposed, the change of the electrode layer 41 to the silicide progresses in the Y-direction or the −Y-direction. Therefore, the cubic expansion of the metal silicide 61 becomes larger than that of the part where the memory hole 75 is disposed, and the projecting portion 41a large in the projection width is formed. For example, the projection width $W_{P2}$ of the projecting portion 41a from the end surface 103e of the insulating film 103 is larger than the projection width $W_{P1}$ of the non-projecting portion 41b shown in FIG. 6A.

As described above, the electrode layer 41 of the non-volatile memory device 1 according to the embodiment has the projecting portions 41a disposed on the side surfaces. Thus, the electrical resistance of the electrode layer 41 changed into the silicide can be reduced.

Specifically, in the memory cell portion 41m provided with the memory hole 75, the width of the electrode layer 41 is substantially reduced, and the amount of silicon atoms is decreased. Therefore, the metal silicide with the composition ratio in which the proportion of the metal atoms is higher than the proportion of the silicon atoms is apt to be formed, and the electrical resistance of the electrode layer 41 tends to increase. In contrast, in the embodiment, by making the change of the electrode layer 41 into the silicide progress to a deeper part, it is possible to increase the cubic expansion of the metal silicide to thereby decrease the electrical resistance. As a result, the projecting portions 41a are formed along the side surfaces of the electrode layer 41.

Further, it is desirable to set the distance between the electrode layers 41 positioned in the same level (height or layer level) to a width with which the projecting portions 41a do not have contact with each other. For example, the distance $W_{S3}$ between the insulating films 103 positioned in the same level (height) is the same as the distance between the electrode layers 41 on which the change into the silicide has not been performed. Therefore, it is desirable for the distance $W_{S3}$ to be larger than twice of the projection width $W_{P2}$ of the projecting portion 41a. Thus, it is possible to avoid the electrical contact between the electrode layers 41 adjacent to each other.

Second Embodiment

Figure 7:
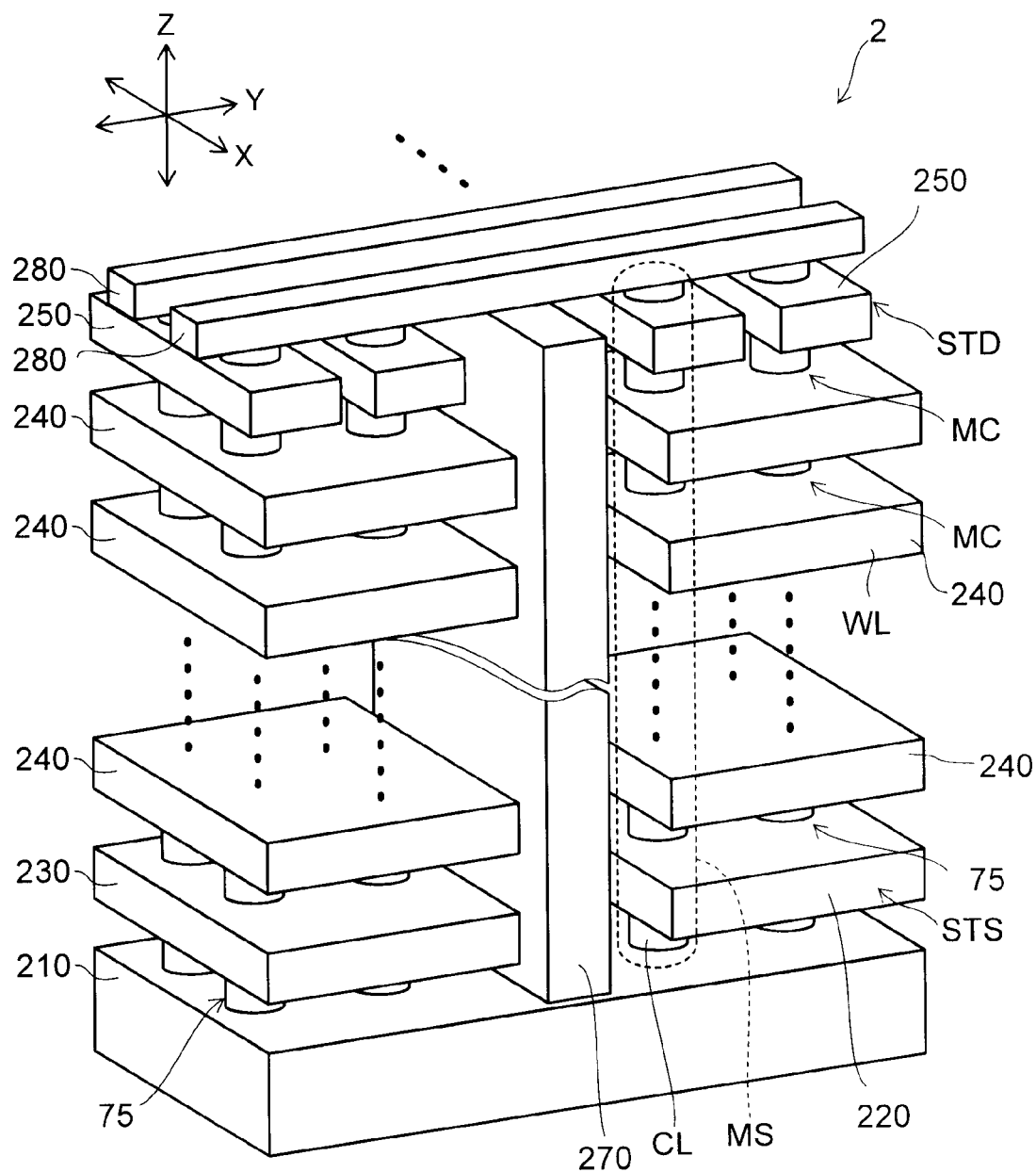
FIG. 7 is a perspective view schematically showing a non-volatile memory device according to a second embodiment.

FIG. 7 is a perspective view schematically showing a non-volatile memory device 2 according to a second embodiment. In FIG. 7, insulating parts between the constituents are not shown.

The non-volatile memory device 2 is provided with a semiconductor layer 210, electrode layers 230, 240, and 250. The semiconductor layer 210 is disposed on a foundation layer or a substrate not shown via an insulating film. The semiconductor layer 210 is, for example, a p-type silicon layer, and functions as a source layer. The semiconductor layer 210 may be a part of a semiconductor substrate. Alternately, the semiconductor layer 210 may be replaced by a layer made of conductive material such as metal. The electrode layers 230, 240, and 250 are stacked on the semiconductor layer 210 via insulating films not shown. The electrode layers 230, 240, and 250 are each disposed so as to extend in the X-direction.

The electrode layer 230 functions as the selection gate electrode on the source side. The electrode layers 240 function as the control gates of the respective memory cells MC. The number of the electrode layers 240 stacked in the Z-direction is the same as the number of the memory cells MC disposed in the Z-direction. The electrode layer 250 functions as the selection gate electrode on the drain side.

The non-volatile memory device 2 has a plurality of columnar sections CL. The columnar sections CL are disposed inside the respective memory holes 75 extending through the electrode layers 230, 240, and 250 in the Z-direction. The columnar sections CL each include the channel body 20, and the memory film 30 (see FIG. 6A).

In a part where the electrode layer 230 and the columnar section CL intersect with each other, there is disposed the selection transistor STS on the source side. The selection transistor STS includes the memory film 30 as the gate insulating film. In a part where the electrode layer 240 and the columnar section CL are intersect with each other, there is disposed the memory cell MC (see FIG. 6A). In a part where the electrode layer 250 and the columnar section CL intersect with each other, there is disposed the selection transistor STD on the drain side. The selection transistor STD includes the memory film 30 as the gate insulating film.

As shown in FIG. 7, the electrode layers 230, 240, and 250 are extended through by a plurality of columnar sections CL. The columnar sections CL extending through the electrode layers 230 and 240 are disposed side by side in the X-direction and the Y-direction, for example. In contrast, the columnar sections CL extending through the electrode layer 250 are formed so as to align in the X-direction, for example. The electrode layers 250 are each formed to have a width in the Y-direction narrower than the electrode layers 240.

The lower end of each of the columnar sections CL is connected to the semiconductor layer 210. Further, above the upper ends of the columnar sections CL, there are disposed bit lines 280. Thus, the channel body 20 in the columnar section CL is electrically connected to the semiconductor layer 210 and the bit line 280. Further, the selection transistor STS, the memory cells MC, and the selection transistor STD disposed in the Z-direction along the columnar section CL form a memory string MS.

Further, in the non-volatile memory device 2, an electrically conductive body 270 is disposed between the electrode layers 230 adjacent in the Y-direction to each other, between the electrode layers 240 adjacent in the Y-direction to each other, and between the electrode layers 250 adjacent in the Y-direction to each other. The electrically conductive body 270 is disposed so as to extend in the X-direction and the Z-direction, and the lower end of the electrically conductive body 270 is electrically connected to the semiconductor layer 210. Further, the electrically conductive body 270 is electrically connected to a source line not shown at the upper end of the electrically conductive body, for example.

Figure 8:
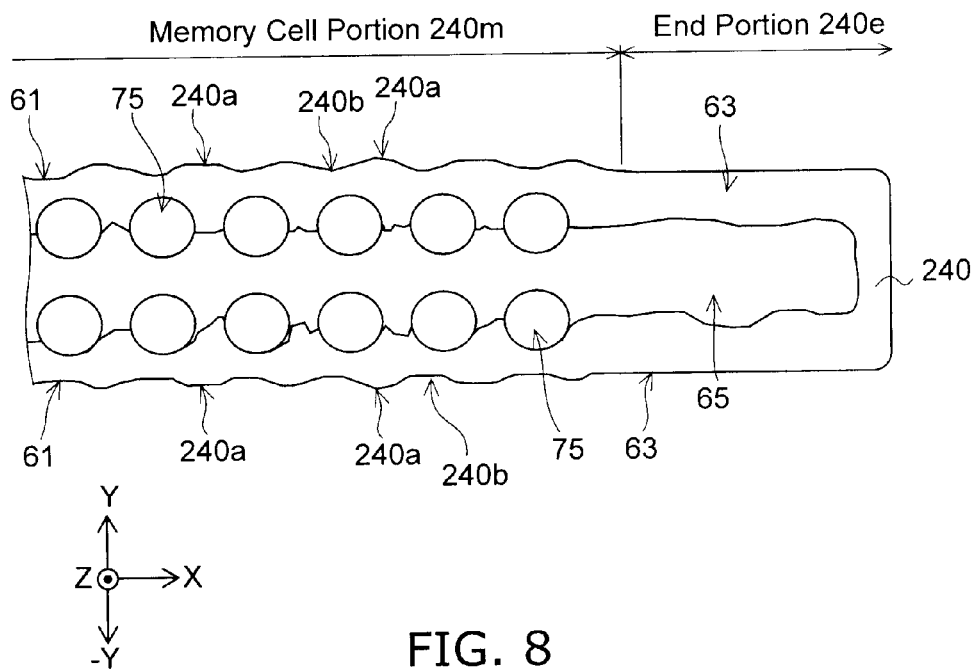
FIG. 8 is a plan view schematically showing the electrode layer of the non-volatile memory device according to the second embodiment.

FIG. 8 is a plan view schematically showing the electrode layer 240 of the non-volatile memory device 2 according to the second embodiment. The electrode layer 240 includes a memory cell portion 240m provided with the memory cells MC, and an end portion 240e.

The electrode layer 240 includes the metal silicide 61, the metal silicide 63, and a part 65 not changed into the silicide. The metal silicide 61 is included in the memory cell portion 240m. The metal silicide 63 is included in the end portion 240e.

As shown in FIG. 8, on the side surfaces of the memory cell portion 240m, there are formed a plurality of projecting portions 240a and non-projecting portions 240b. The projecting portions 240a are each a part formed by the metal silicide 61 expanding in volume in the Y-direction of the −Y-direction. The metal silicide 61 included in the memory cell portion 240m has, for example, a composition ratio in which the proportion of the metal atoms is higher than the proportion of the silicon atoms, and is higher in the specific resistance than the metal silicide 63 provided to the end portion 240e. Therefore, also in the embodiment, by forming the projecting portions 240a, it is possible to decrease the electrical resistance of the metal silicide 61 to decrease the electrical resistance of the electrode layers 240.

It should be noted that although FIG. 8 shows an example of the electrode layer 240 having the memory holes 75 disposed in two lines, the embodiment is not limited to this example. For example, it is also possible to dispose three or more lines of memory holes 75, or to dispose the memory holes 75 in a zigzag manner.

Third Embodiment

Figure 9:
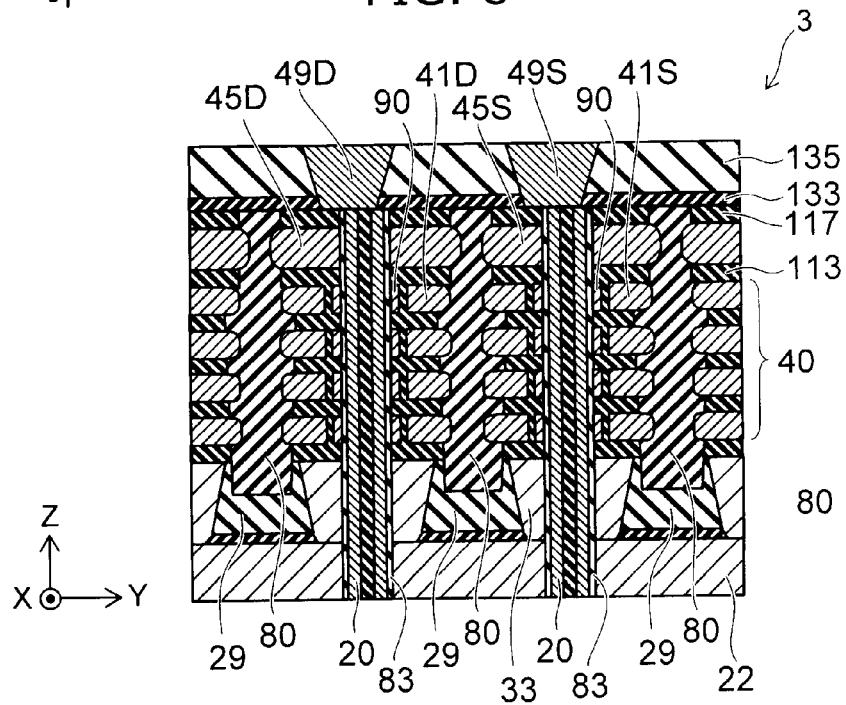
FIG. 9 is a cross-sectional view schematically showing a non-volatile memory device according to a third embodiment.

FIG. 9 is a schematic cross-sectional view showing a non-volatile memory device 3 according to a third embodiment. The non-volatile memory device 3 also comprises a channel body 20 extending through a laminated electrode 40 and a selection gate electrode 45 in the Z-direction. The laminated electrode 40 includes electrode layers 41D or electrode layers 41S. Each of electrode layers 41 includes a silicide portion around a channel body 20, and has a plurality of projecting portions 41c (see FIGS. 5A and 5B).

As shown in FIG. 9, the non-volatile memory device 3 comprises charge storage portions 90 each including a conductive material such as polysilicon. The charge storage portions 90 are disposed along the channel bodies 20, and separated from each other.

One set of the charge storage portions 90 is provided along a channel body 20 on a source side. Each charge storage portion 90 in the one set is provided between a cannel body 20 and an electrode layer 41S. Other set of charge storage portions 90 is provided along a channel body 20 on a drain side, and each charge storage portion 90 in the other set is provided between a channel body 20 and an electrode layer 41D. Each charge storage layer 90 is electrically isolated from a channel body 20 by an insulating film 83 which acts as the tunnel insulating film. The each charge storage layer 90 is also isolated from the electrode layer 41 by a part of an insulating film 133 therebetween.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A non-volatile memory device comprising:
a first electrode layer extending in a first direction; and
a first channel body extending through the first electrode layer in a second direction,
the first electrode layer having, on a side surface, a first projecting portion expanding in a third direction perpendicular to the first direction and the second direction, and having a rounding shape in a tip of the first projecting portion.

2. The device according to claim 1, wherein
the first projecting portion includes a metal silicide.

3. The device according to claim 2, wherein
the metal silicide includes at least one metal element selected from a group of nickel, cobalt, titanium, tungsten, and molybdenum.

4. The device according to claim 2, wherein
the metal silicide has a composition ratio in which a proportion of metal atoms is higher than a proportion of silicon atoms.

5. The device according to claim 1, further comprising:
a charge storage portion provided between the first electrode layer and the first channel body.

6. The device according to claim 5, further comprising:
a first insulating film disposed between the first electrode layer and the charge storage portion,
wherein the metal silicide is in contact with the first insulating film.

7. The device according to claim 1, wherein
the first electrode layer includes silicon.

8. The device according to claim 1, further comprising:
a second electrode layer disposed side by side with the first electrode layer in the second direction, and extending in the first direction; and
a second insulating film disposed between the first electrode layer and the second electrode layer,
the first channel body extending through the first electrode layer, the second insulating film, and the second electrode layer in the second direction, and
the first projecting portion projecting in the third direction from an end of the second insulating film.

9. The device according to claim 1, further comprising:
a second channel body disposed side by side with the first channel body in the first direction, and extending through the first electrode layer in the second direction,
the first projecting portion having a width expanding in the third direction of the first electrode layer in an area between the first channel body and the second channel body.

10. The device according to claim 9, further comprising:
a third electrode layer disposed side by side with the first electrode layer in the third direction, and extending in the first direction; and
a third channel body extending through the third electrode layer in the second direction,
the third channel body being located between the first channel body and the second channel body when viewed in the third direction.

11. The device according to claim 10, wherein
the third electrode layer has a second projecting portion expanding toward the first electrode layer,
the first projecting portion expands toward the third channel body, and
the second projecting portion expands toward the first channel body.

12. The device according to claim 1, further comprising:
a fourth channel body disposed side by side with the first channel body in the third direction, and extending through the first electrode layer in the second direction,
the first channel body being located between the side surface of the first electrode layer including the first projecting portion and the fourth channel body.

13. The device according to claim 1, further comprising:
a second electrode layer disposed side by side with the first electrode layer in the second direction, and extending in the first direction;
a second insulating film disposed between the first electrode layer and the second electrode layer;
a third electrode layer disposed side by side with the first electrode layer in the third direction, and extending in the first direction;
a fourth electrode layer extending in the first direction, the fourth electrode layer being disposed side by side with the second electrode layer in the third direction, and being disposed side by side with the third electrode layer in the second direction; and
a third insulating film disposed between the third electrode layer and the fourth electrode layer,
the first projecting portion projecting in the third direction from an end of the second insulating film in each of the first electrode layer and the second electrode layer, and
a distance between the second insulating film and the third insulating film being larger than twice of a width in the third direction of the first projecting portion.

14. The device according to claim 1, wherein
the first electrode layer includes a first part and a second part, the first channel body being provided in the first part and not provided in the second part;
the first part includes a first metal silicide; and
the second part includes a second metal silicide having a composition ratio in which a proportion of metal atoms is lower than a proportion of the first metal silicide.

15. The device according to claim 14, wherein
a specific resistance of the first metal silicide is higher than a specific resistance of the second metal silicide.

* * * * *